US007022190B2

(12) United States Patent
Matsuyama

(10) Patent No.: US 7,022,190 B2
(45) Date of Patent: Apr. 4, 2006

(54) SUBSTRATE COATING UNIT AND SUBSTRATE COATING METHOD

(75) Inventor: Yuji Matsuyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 10/146,799

(22) Filed: May 17, 2002

(65) Prior Publication Data

US 2002/0176936 A1 Nov. 28, 2002

(30) Foreign Application Priority Data

May 22, 2001 (JP) .............................. 2001-152424

(51) Int. Cl.
*B05C 11/00* (2006.01)
(52) U.S. Cl. ............................. 118/692; 118/63; 239/76
(58) Field of Classification Search ................ 118/320, 118/326, 692, 683, 684, 685, 679, 62, 63, 118/3.15, 669, 313; 134/902; 396/611, 604; 239/76

See application file for complete search history.

(56) References Cited

U.S. PATENT DOCUMENTS

| 5,815,762 A | * | 9/1998 | Sakai et al. ................. 396/611 |
| 5,919,520 A | | 7/1999 | Tateyama et al. |
| 5,935,331 A | * | 8/1999 | Naka et al. .................. 118/319 |
| 5,942,035 A | | 8/1999 | Hasebe et al. |
| 6,207,231 B1 | * | 3/2001 | Tateyama .................... 427/240 |
| 6,796,517 B1 | * | 9/2004 | Pike ............................. 239/557 |
| 2001/0003964 A1 | * | 6/2001 | Kitano et al. ................. 118/50 |

FOREIGN PATENT DOCUMENTS

JP            06-226181 A   *  8/1994

OTHER PUBLICATIONS

Machine Translation of JP06-226181 (see Foreign patents above).*

* cited by examiner

*Primary Examiner*—George Koch
(74) *Attorney, Agent, or Firm*—Oblon, Spivak, McClelland, Maier & Neustadt, P.C.

(57) ABSTRACT

The present invention is a coating unit for coating a substrate with a coating solution, comprising a coating solution discharge member for discharging the coating solution to the substrate which is positioned in a downward part. A lower surface of the coating solution discharge member is in a shape having a length longer, at least, than the radius of the substrate and having a narrow width. A coating solution discharge port is disposed in a portion of the coating solution discharge member, facing the center of the substrate, while a solvent mist discharge port for discharging a solvent mist of the coating solution is disposed in a portion facing a peripheral portion including an outer edge potion of the substrate, when the coating solution discharge member is positioned above the radius of the substrate.

7 Claims, 13 Drawing Sheets

SUBSTRATE COATING UNIT AND SUBSTRATE COATING METHOD

BACKGROUND OF THE INVENTION

1. Field of the Invention

The present invention relates to a unit and a method for coating a substrate with a coating solution.

2. Description of the Related Art

In a photolithography process, for example, in semiconductor device fabrication processes, a resist coating treatment of coating the surface of a wafer with a resist solution to form a resist film, an exposure treatment of exposing a wafer in a pattern, a developing treatment of developing the exposed wafer, and so on are carried out in sequence to form a predetermined circuit pattern on the wafer.

The above-mentioned resist coating treatment is usually carried out by a resist coating unit. This resist coating unit has a spin chuck for horizontally holding the wafer by suction and rotating the wafer and a discharge nozzle which moves to a position above the center of the wafer to discharge the resist solution onto the wafer. At the time of the resist coating, the resist solution is discharged from the discharge nozzle onto the center of the rotated wafer and is diffused by a centrifugal force so that a resist film is formed on the surface of the wafer.

In order to diffuse the resist solution, the viscosity of the resist solution needs to be low and for this purpose, a predetermined amount of a solvent is included in the resist solution in advance.

When the resist solution is diffused while the wafer is rotated as described above, however, a circumferential speed in a region closer to an outer edge portion of the wafer becomes higher so that the solvent in the resist solution is volatilized before the resist solution reaches the outer edge portion of the wafer and the resist solution is not sometimes diffused appropriately. Even when it is diffused, an uneven resist film may possibly be formed over the wafer since a film thickness on the wafer center portion differs from that on the outer edge portion and a peripheral portion of the wafer.

When the uneven resist form is thus formed, portions usable as a semiconductor device are lessened to cause decrease in yield. Especially, since the amount of the resist solution supplied onto the wafer tends to be reduced in response to the recent demand for a thinner resist film and reduction in the amount of the resist solution, it is very important to maintain the viscosity of the resist solution supplied onto the wafer to form an appropriate film.

SUMMARY OF THE INVENTION

The present invention is made in consideration of the above-described points, and it is an object of the present invention to form a predetermined coating film also in an outer edge portion and a peripheral portion of a substrate, thereby forming a uniform coating film on the entire surface of the substrate when the substrate such as a wafer is coated with a coating solution such as a resist solution.

In order to achieve the above object, according to a first aspect of the present invention, the present invention is a coating unit for coating a substrate with a coating solution, comprising a coating solution discharge member for discharging the coating solution onto the substrate which is in a downward position, and a lower surface of the coating solution discharge member has a shape with a longer length at least than the radius of the substrate and with a narrow width. A coating solution discharge port for discharging the coating solution and a solvent mist discharge port for discharging a solvent mist of the coating solution are so disposed in portions of the coating solution discharge member that the former faces the center of the substrate and the latter faces a peripheral portion including an outer edge portion of the substrate respectively when the coating solution discharge member is positioned above the radius of the substrate.

The coating solution discharge member may be so structured that it includes: a storage section communicating with the coating solution discharge port and temporarily storing the coating solution, which is supplied into the coating solution discharge member at a predetermined pressure, before it is discharged; and a discharge pressure adjusting chamber positioned under the storage section, the coating solution discharge port opens into the discharge pressure adjusting chamber, the discharge pressure adjusting chamber has a slit provided in a position of a bottom surface thereof facing the coating solution discharge port, and further, the pressure in the discharge pressure adjusting chamber is adjustable by a pressure adjusting unit.

The coating solution discharge member may also be so structured that it includes: a storage section communicating with the coating solution discharge port and temporarily storing the coating solution, which is supplied into the coating solution discharge member at a predetermined pressure, before it is discharged; a discharge pressure adjusting chamber positioned under the storage section; and a gas supply passage through which a gas containing the solvent mist supplied into the coating solution discharge member passes and which communicates with the solvent mist discharge port, the coating solution discharge port opens into the discharge pressure adjusting chamber, the gas supply passage communicates with the discharge pressure adjusting chamber, the discharge pressure adjusting chamber has a slit provided in a position of a bottom surface thereof facing the coating solution discharge port, and further, the pressure of the gas supplied into the gas supply passage is adjustable by a pressure adjusting unit.

According to a second aspect of the present invention, the present invention is a method for coating a substrate with a coating solution and it uses a coating solution discharge member which has a shape with a longer length at least than the radius of the substrate and which includes a coating solution discharge port for discharging the coating solution onto the center of the substrate and a solvent mist discharge port for discharging a solvent mist of the coating solution onto a peripheral portion including an outer edge portion of the substrate. The present invention described above comprises the steps of: discharging only the coating solution to the substrate from the coating solution discharge port; subsequently discharging the solvent mist onto the peripheral portion of the substrate from the solvent mist discharge port in a mid-course of diffusing the coating solution on the substrate by rotating the substrate; and thereafter, continuously discharging the solvent mist with a discharge amount of the solvent mist being reduced.

According to the present invention, when the coating solution applied onto the center of the substrate is diffused by a centrifugal force, the solvent mist is supplied to the peripheral portion including the outer edge portion of the substrate to enable the viscosity of the coating solution to be maintained low. Consequently, the coating solution is smoothly diffused up to the outer edge portion of the substrate so that a uniform coating film is formed on the surface of the substrate. Further, since the solvent in a mist state is supplied, it is possible to supply a larger amount of the solvent to the substrate in a shorter time compared with a case when vapor of the solvent is supplied.

DETAILED DESCRIPTION OF THE PREFERRED EMBODIMENTS

Figure 1:
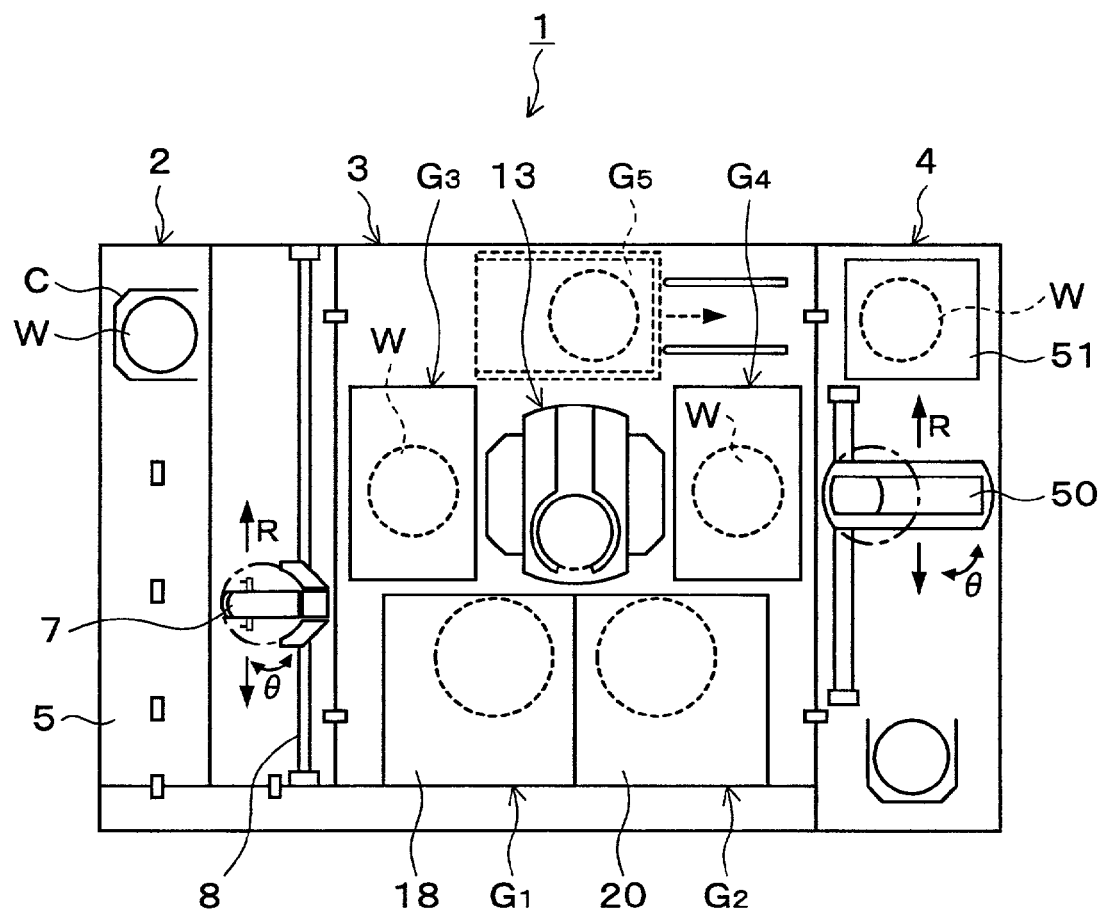
FIG. 1 is a plan view showing a diagrammatic structure of a coating and developing system on which a resist coating unit according to an embodiment is mounted.
Figure 2:
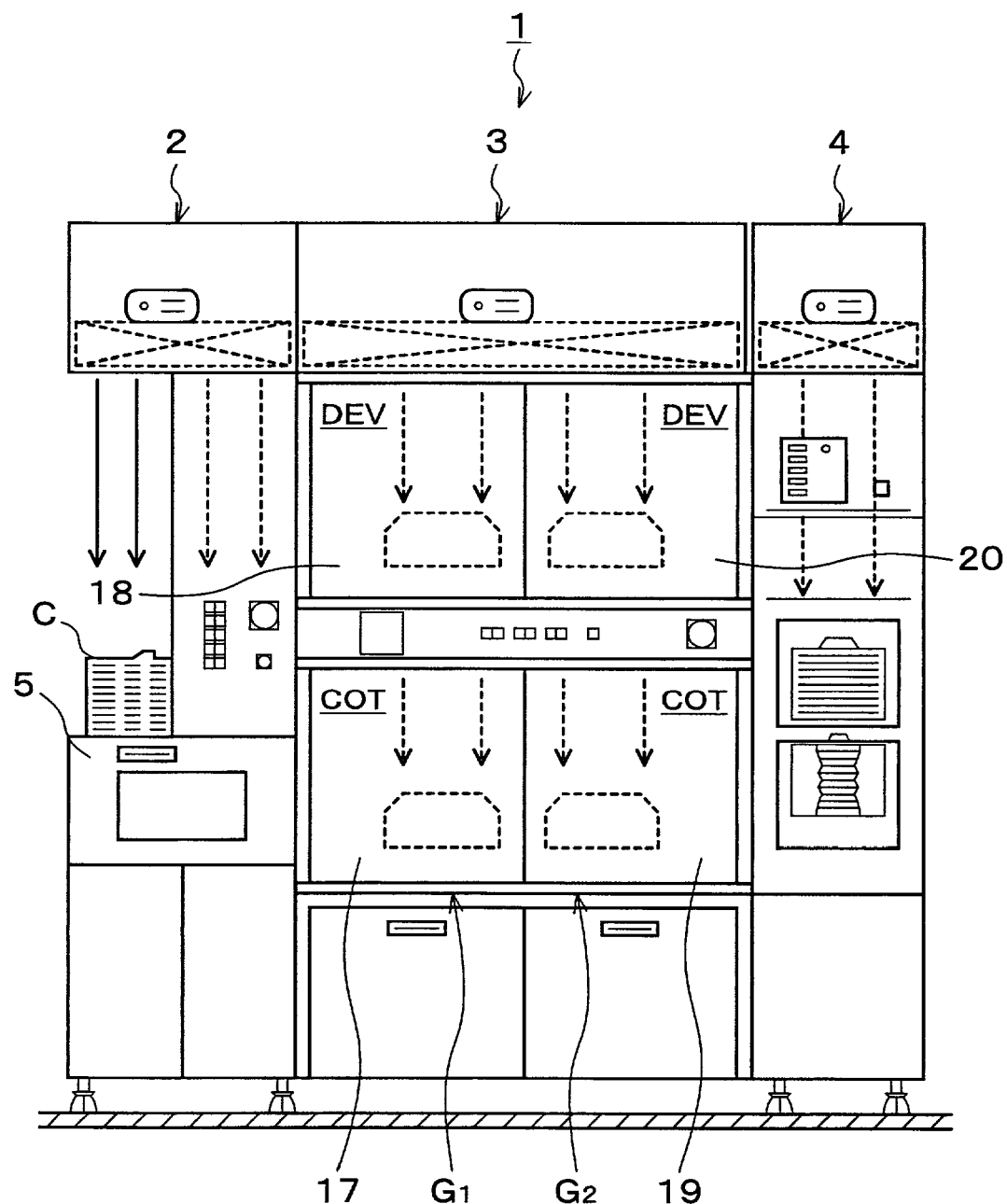
FIG. 2 is a front view of the coating and developing system in FIG. 1.
Figure 3:
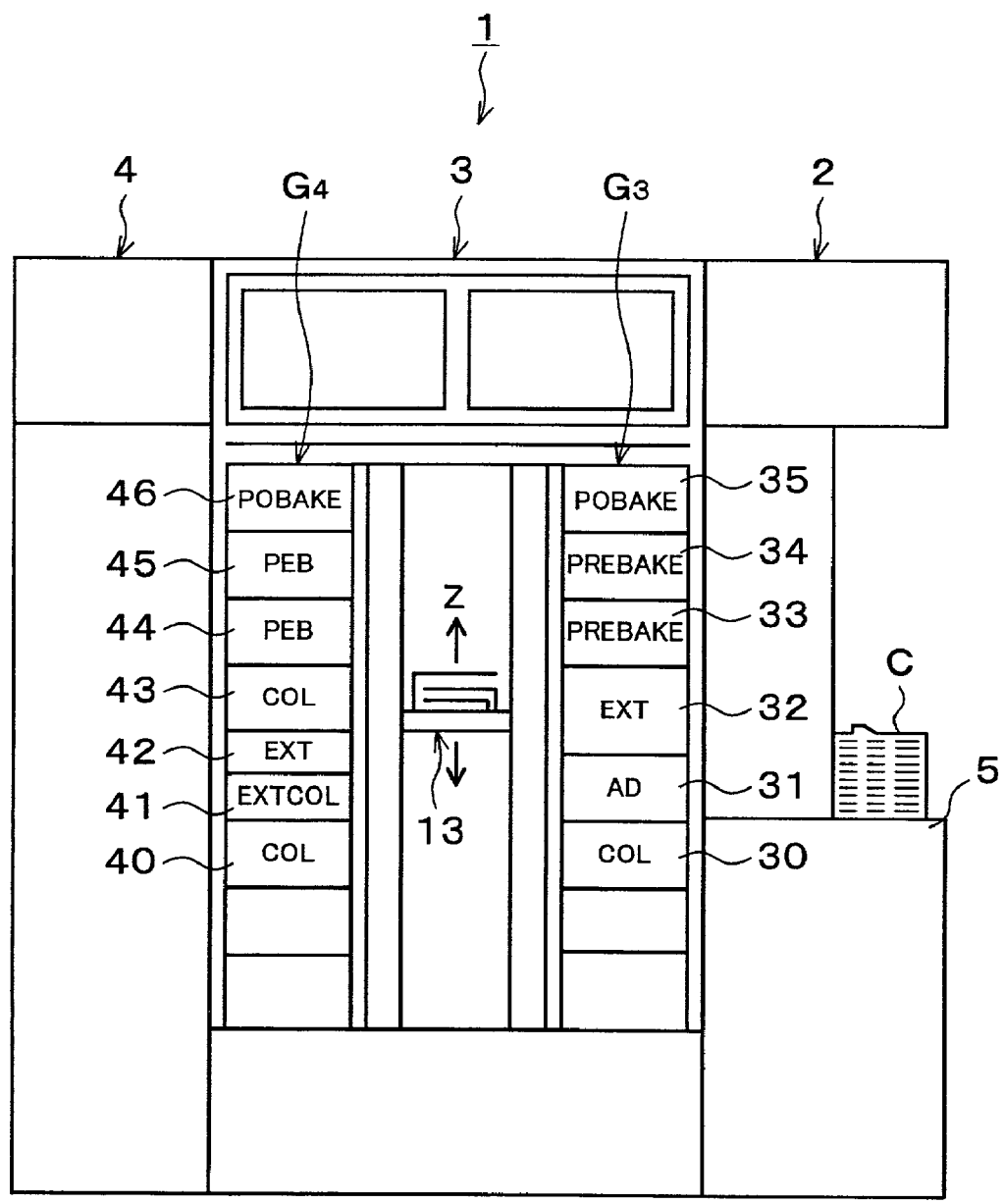
FIG. 3 is a rear view of the coating and developing system in FIG. 1.

Preferred embodiments of the present invention will be described below to explain the present invention in detail. FIG. 1 is a plan view diagrammatically showing the structure of a coating and developing system 1 on which a substrate coating unit according to this embodiment is mounted, FIG. 2 is a front view of the coating and developing system 1, and FIG. 3 is a rear view of the coating and developing system 1.

As shown in FIG. 1, the coating and developing system 1 has a structure of integrated connection of a cassette station 2 for carrying, for example, 25 wafers W from/to the outside to/from the coating and developing system 1 in the unit of cassette and for carrying the wafers W into/from a cassette C, a processing station 3 with various kinds of processing units disposed in multi-tiers for performing predetermined processing wafer by wafer in a coating and developing process, and an interface section 4 provided adjacent to the processing station 3, for receiving and delivering the wafer W from/to an aligner which is not shown.

In the cassette station 2, a plurality of the cassettes C are mountable at a predetermined position on a cassette mounting table 5, which serves as a mounting section, in a line in an R-direction (a vertical direction in FIG. 1). Further, a wafer carrier 7, which is transferable in the direction of this cassette alignment (the R-direction) and in the direction of the wafer alignment of the wafers W housed in the cassette C (a Z-direction; a perpendicular direction), is provided to be movable along a carrier guide 8 so that it can selectively access each of the cassettes C.

The wafer carrier 7 has an alignment function of aligning the wafer W. This wafer carrier 7 can also access an extension unit 32 included in a third processing unit group G3 on the side of the processing station 3 as will be described later.

In the processing station 3, a main carrier 13 is provided in a center part thereof, and various kinds of processing units are multi-tiered on the periphery of the main carrier 13 to compose processing unit groups. In the coating and developing system 1, there are four processing unit groups G1, G2, G3 and G4, and the first and second processing unit groups G1 and G2 are disposed on the front side of the coating and developing system 1, the third processing unit group G3 is disposed adjacent to the cassette station 2, and the fourth processing unit group G4 is disposed adjacent to the interface section 4. Further, as an option, a fifth processing unit group G5 depicted by a broken line can be additionally arranged on the rear side. The main carrier 13 can carry the wafer W into/from various kinds of later-described processing units disposed in these processing unit groups G1, G2, G3, G4, and G5. Incidentally, the number and the arrangement of the processing unit groups vary depending on the kind of the processing given to the wafer W and the number of the processing unit groups can be selected freely.

In the first processing unit group G1, for example, as shown in FIG. 2, a resist coating unit 17 as the substrate coating unit according to this embodiment and a developing unit 18 for developing the exposed wafer W are two-tiered in the order from the bottom. Similarly, in the second processing unit group G2, a resist coating unit 19 and a developing unit 20 are two-tiered in the order from the bottom.

In the third processing unit group G3, for example, as shown in FIG. 3, a cooling unit 30 for cooling the wafer W, an adhesion unit 31 for increasing fixability between the resist solution and the wafer W, the extension unit 32 for delivering the wafer W thereto and therefrom, pre-baking units 33 and 34 for evaporating a solvent in the resist solution, and a post-baking unit 35 for performing heating processing after the developing treatment are, for example, six-tiered in the order from the bottom.

In the fourth processing unit group G4, for example, a cooling unit 40, an extension and cooling unit 41 for spontaneously cooling the placed wafer W, an extension unit 42, a cooling unit 43, post-exposure baking units 44 and 45 for performing heating processing after the exposure treatment, and a post-baking unit 46 for performing heating processing after the developing treatment are, for example, seven-tiered in the order from the bottom.

In a center part of the interface section 4, for example, a wafer carrier 50 is provided as shown in FIG. 1. This wafer carrier 50 is structured so as to be movable in the the R-direction (the vertical direction in FIG. 1) and the Z-direction (the perpendicular direction), and to be rotatable in a θ-direction (a rotational direction about an axis Z), so that it can access the extension and cooling unit 41 and the extension unit 42 which are included in the fourth processing unit group G4, an edge exposure unit 51, and a not-shown aligner to carry the wafer W to each of them.

Figure 4:
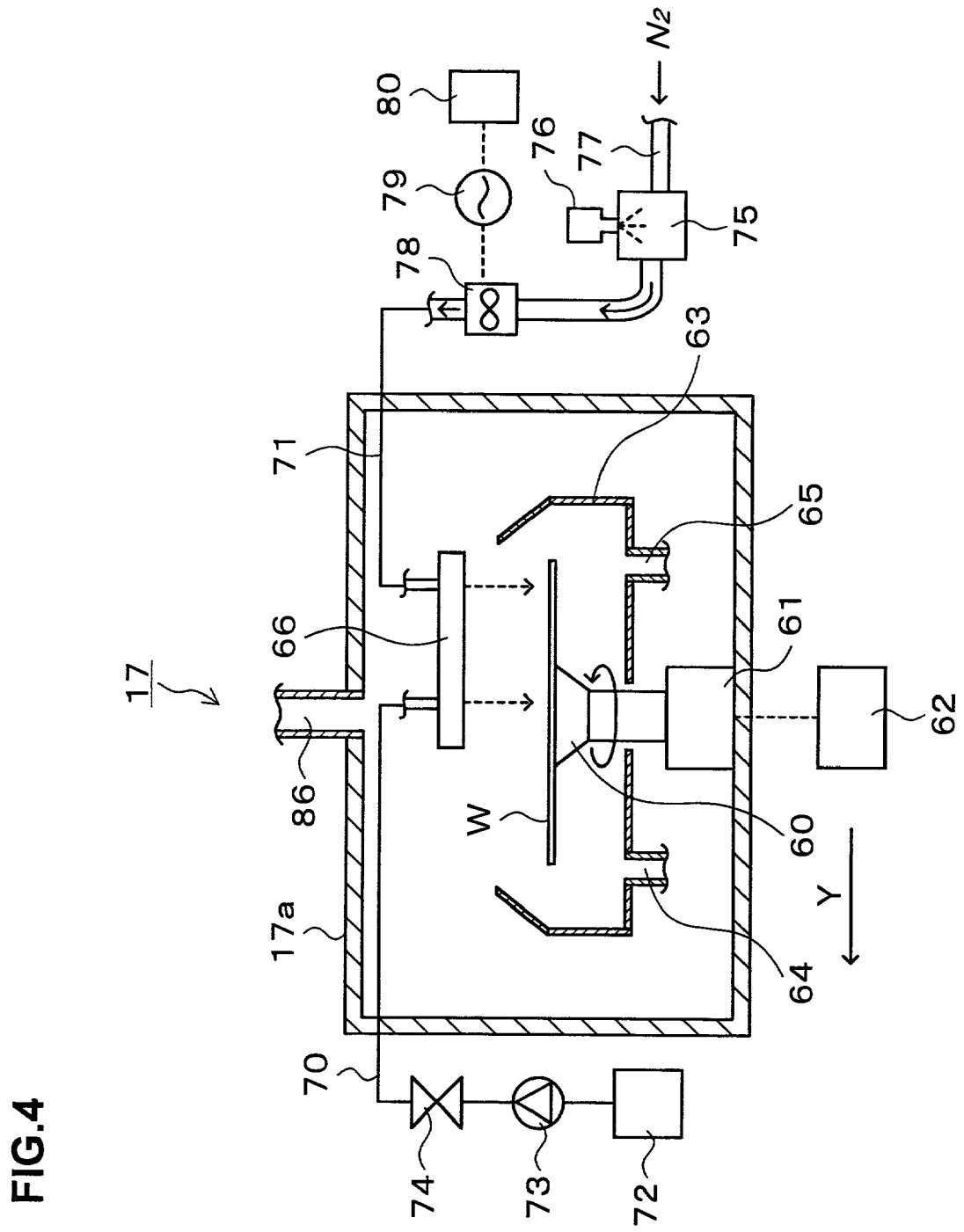
FIG. 4 is an explanatory view of a vertical cross section showing a diagrammatic structure of the resist coating unit according to the embodiment.

Next, the structure of the above-mentioned resist coating unit 17 will be explained. FIG. 4 is an explanatory view of a vertical cross section showing a diagrammatic structure of the resist coating unit 17 and FIG. 5 is an explanatory view of a horizontal cross section showing a diagrammatic structure of the resist coating unit 17.

As shown in FIG. 4, the resist coating unit 17 includes a casing 17a and in the casing 17a, it has a spin chuck 60 which is a wafer W holding means. The spin chuck 60 has a horizontal surface on its upper surface and on this upper surface, a not-shown suction port, for example, for sucking the wafer W is provided. Therefore, the spin chuck 60 can horizontally hold the wafer W by suction. Under the spin chuck 60, a drive section 61 provided with, for example, a motor or the like is disposed. The drive section 61 is controlled by a control unit 62 and can rotate the spin chuck 60 at a predetermined rotation speed.

Outside the spin chuck 60, a cup 63 for receiving and collecting the resist solution and so on scattered from the wafer W is provided. The cup 63 has a substantially cylindrical shape with an upper surface thereof being open and is formed to surround areas outside and under the wafer W on the spin chuck 60. In a bottom surface of the cup 63, a drainpipe 64 for draining out the collected resist solution and so on and an exhaust duct 65 for exhausting an atmosphere inside the cup 63 are provided.

Figure 5:
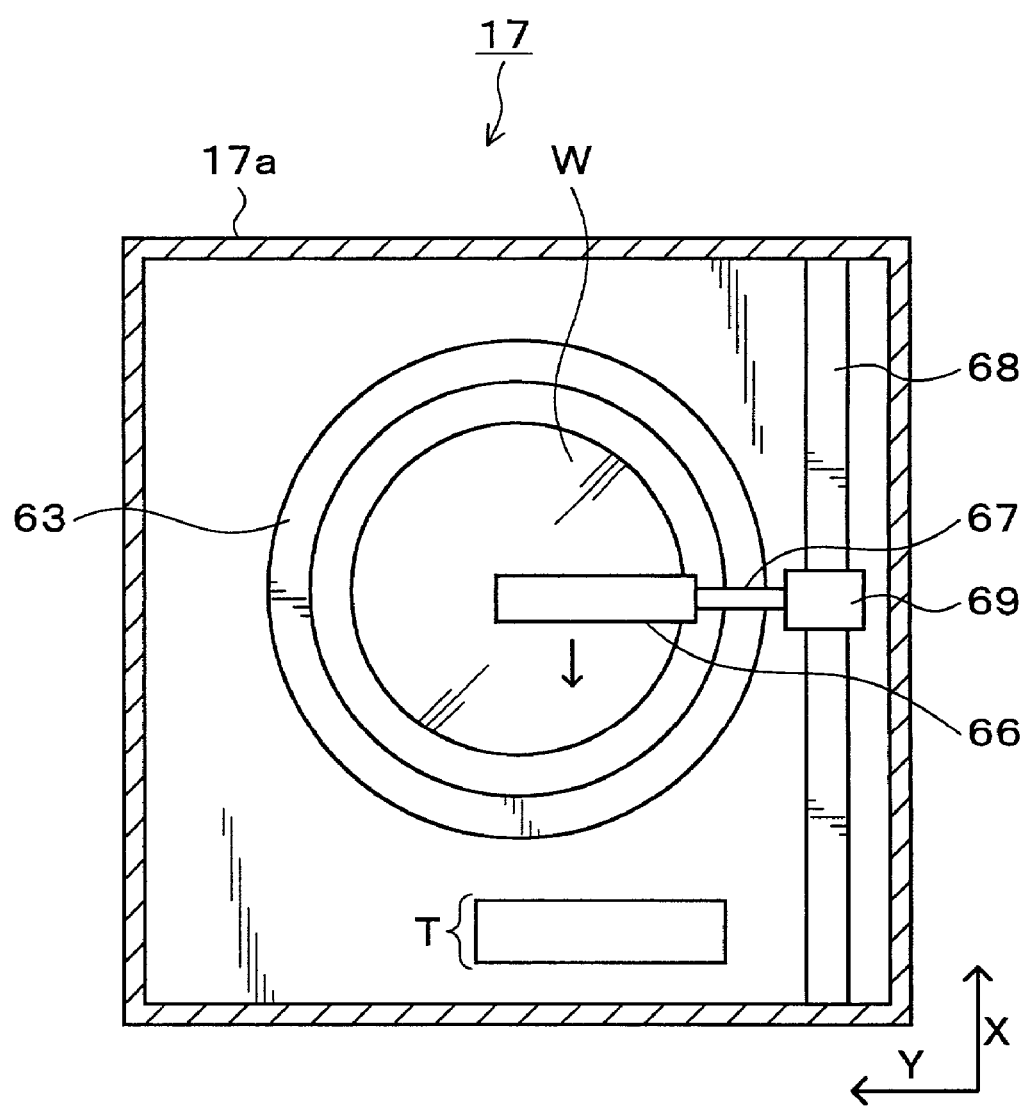
FIG. 5 is an explanatory view of a horizontal cross section showing a diagrammatic structure of the resist coating unit according to the embodiment.

A discharge nozzle 66 as a coating solution discharge member is supported by an arm 67, for example, as shown in FIG. 5. A rail 68 extending in an X direction (a vertical direction in FIG. 5) is provided in the casing 17a to enable the arm 67 to move on the rail 68. The arm 67 includes a drive section 69 provided with, for example a motor or the like so that it can freely move on the rail 68. A stand-by position T for the discharge nozzle 66 is set outside the cup 63 on a negative direction side of the X direction (a downward side in FIG. 5) of the cup 63, and a not-shown washing tank for washing, for example, the discharge nozzle 66 is disposed in the stand-by position T.

The arm 67 enables the discharge nozzle 66 to reciprocate between the stand-by position T and a position above the wafer W in the cup 63. The drive section 69 of the arm 67 is provided with a function of hoisting/lowering the arm 67 to hoist/lower the arm 67 when necessary so that the distance between the discharge nozzle 66 and the wafer W can be adjusted.

Figure 6:
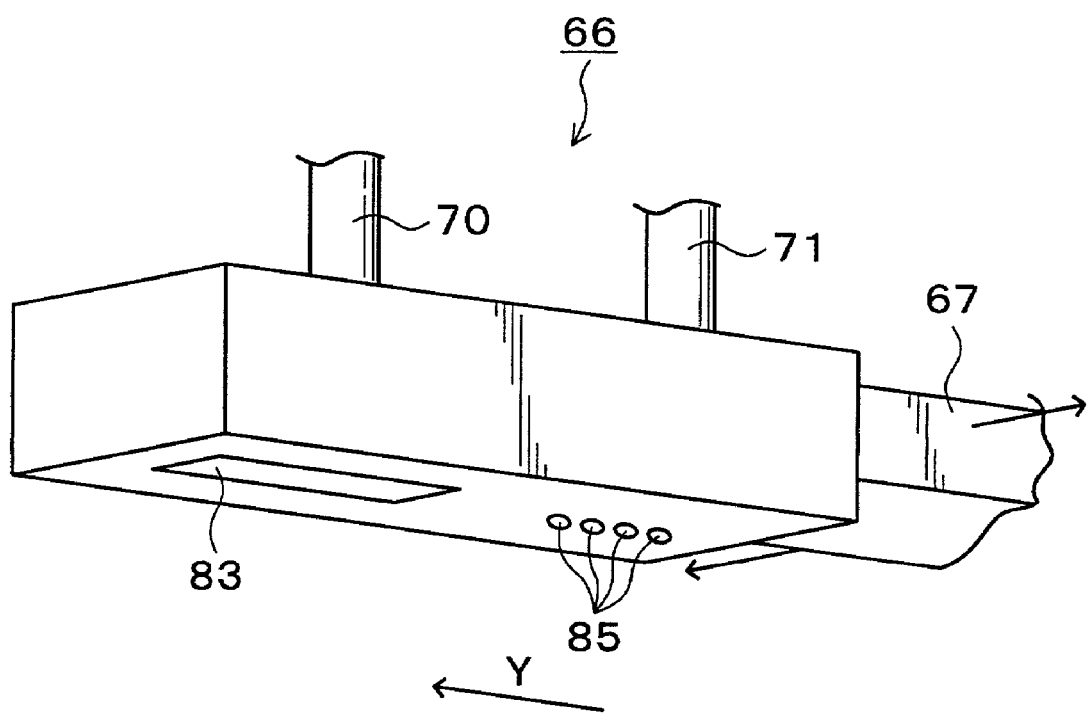
FIG. 6 is a perspective view of a discharge nozzle.

The discharge nozzle 66 has an elongated shape which is slightly longer than the radius of the wafer W as shown in FIG. 4, FIG. 5, FIG. 6, and so on. At least its lower surface needs to be an elongated shape. The discharge nozzle 66 is supported by the arm 67 in such a manner that, seen from the plane surface, one end of the discharge nozzle 66 is positioned near an end portion of the wafer W and the other end portion of the discharge nozzle 66 is positioned near the center part of the wafer W when the discharge nozzle 66 reaches the position above the radius of the wafer W after moving in a parallel direction to the X direction. As shown in FIG. 6, a supply pipe 70 for supplying the resist solution as a coating solution is connected to an upper part on a positive direction side of a Y direction of the discharge nozzle 66, and a gas supply pipe 71 for supplying a mist-containing gas inclusive of a solvent mist of the resist solution is connected to an upper part on a negative direction side of the Y direction of the discharge nozzle 66.

The supply pipe 70 is connected to a resist tank 72 which is a supply source of the resist solution as shown in FIG. 4. A pump 73 for sending, for example, the resist solution in the resist tank 72 by a set pressure is provided in the supply pipe 70. An open/close valve 74 is disposed in the supply pipe 70 between the pump 73 and the discharge nozzle 66 so that the supply of the resist solution to the discharge nozzle 66 can be started and stopped. Therefore, the resist solution in the resist tank 72 is sent through the supply pipe 70 by the fixed set pressure by the pump 73 and is supplied into the discharge nozzle 66 by opening/closing the open/close valve 74.

The gas supply pipe 71 is connected to a gas producing tank 75 in which the mist-containing gas is produced and which becomes a supply source of the mist-containing gas. A sprayer 76 for spraying, for example, the solvent mist of the resist solution is attached to the gas producing tank 75, and a pipe 77 for supplying a carrier gas such as a nitrogen gas into the gas producing tank 75 is connected to the gas producing tank 75. By supplying the carrier gas into the gas producing tank 75 from the pipe 77 and spraying the solvent mist from the sprayer 76, the mist-containing gas is produced inside the gas producing tank 75.

A fan 78 for sending, for example, the mist-containing gas in the gas producing tank 75 to the discharge nozzle 66 by a predetermined pressure is provided in the gas supply pipe 71. The fan 78 is operated by electric power and a power source 79 and a control section 80 which can operate this power source 79 are connected to the fan 78. The control section 80, which can set the pressure of the mist-containing gas flowing through the gas supply pipe 71, can adjust the rotation speed of the fan 78 by controlling the voltage of the power source 79 so as to cause the pressure of the mist-containing gas to be the set pressure. Therefore, the pressure of the mist-containing gas supplied into the discharge nozzle 66 is controlled by the control section 80. Note that, in this embodiment, the fan 78, the power source 79, and the control section 80 play a role of a pressure adjusting unit for adjusting the pressure of the mist-containing gas supplied into the discharge nozzle 66. Incidentally, as another means for adjusting the pressure of the mist-containing gas, bubbling for spouting the carrier gas from a bottom part of a tank storing a solvent may be performed and an open/close valve may be provided in the gas supply pipe 71 to adjust the aforesaid pressure.

Figure 7:
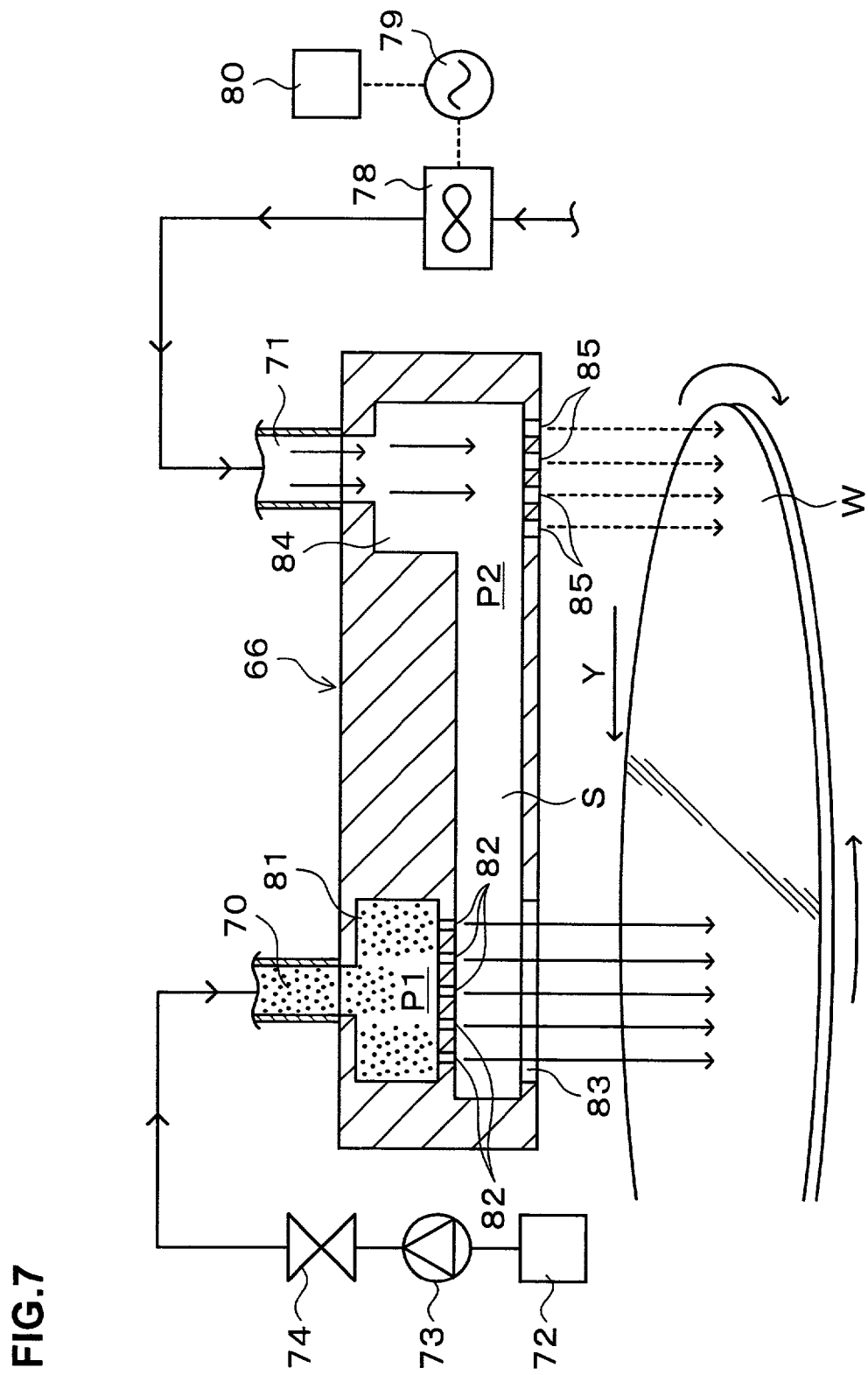
FIG. 7 is an explanatory view of a vertical cross section showing the structure inside the discharge nozzle.

A storage section 81 for temporarily storing the resist solution from the supply pipe 70 is provided on a positive direction side of a Y direction inside the discharge nozzle 66 as shown in FIG. 7. The storage section 81 is positioned in an upper part of the discharge nozzle 66 and forms a space having a predetermined capacity. A plurality of resist solution discharge ports 82 as coating solution discharge ports are arranged in line in the Y direction on a lower surface of the storage section 81. The resist solution discharge ports 82 are disposed so as to be positioned above the center of the wafer W when the discharge nozzle 66 is transferred to the position above the radius of the wafer W. The resist solution discharge ports 82 communicate with the storage section 81 so that the resist solution supplied into the storage section 81 is discharged from each of the resist solution discharge ports 82.

A space elongated in a longitudinal direction of the discharge nozzle 66 is formed under the storage section 81 in a lower part of the discharge nozzle 66. This space is a discharge pressure adjusting chamber S whose pressure can be maintained at a predetermined value. The resist solution discharge ports 82 open into the discharge pressure adjusting chamber S. Therefore, the resist solution in the storage section 81 is discharged from the resist solution discharge ports 82 due to a pressure difference between the storage section 81 and the discharge pressure adjusting chamber S. In other words, when the pressure of the storage section 81 is maintained at pressure, the discharge pressure of the resist solution can be determined by the pressure of the discharge pressure adjusting chamber S.

Figure 8:
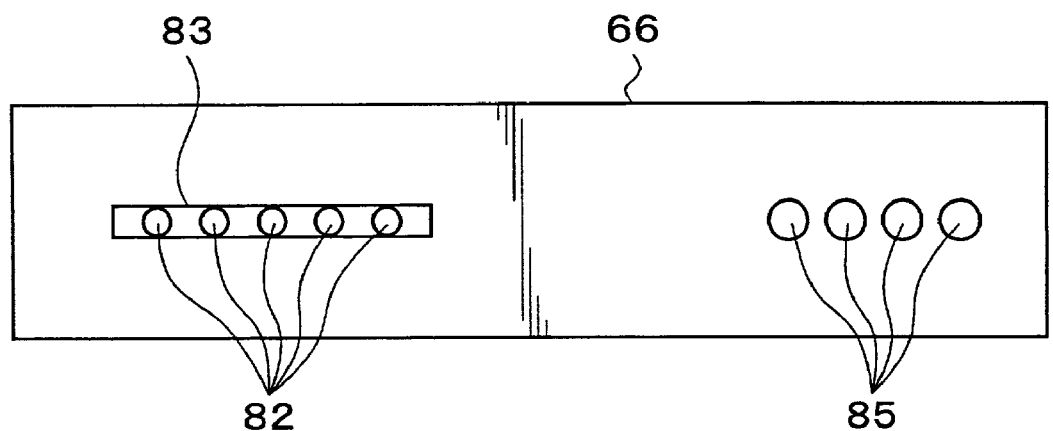
FIG. 8 is a bottom view of the discharge nozzle.

As shown in FIG. 8, a slit 83 which is open toward a wafer W side is provided on a position of a lower surface of the discharge nozzle 66, which is a position facing the resist solution discharge ports 82 of the discharge pressure adjusting chamber S. The resist solution discharged from the resist solution discharge ports 82 passes through the slit 83 to be supplied to the wafer W. The slit 83 is formed in a shape elongated in the Y direction and is formed to have a width size within a very narrow range, for example, 0.5 mm to 1.0 mm in order to maintain and stabilize the pressure inside the discharge pressure adjusting chamber S.

By the above-described structure, the resist solution supplied into the discharge nozzle 66 by the pump 73 is temporarily stored in the storage section 81, discharged from the resist solution discharge ports 82 at a discharge pressure determined by the pressure inside the discharge pressure adjusting chamber S, and passes through the discharge pressure adjusting chamber S and the slit 83 to be discharged near the center of the wafer W.

A gas supply passage 84 through which the mist-containing gas from the gas supply pipe 71 passes is provided on a negative direction side of the Y direction inside the discharge nozzle 66 as shown in FIG. 7. The gas supply passage 84 is formed in a perpendicular direction in the discharge nozzle 66 and mist-containing gas discharge ports 85 as solvent mist discharge ports which are provided on the lower surface of the discharge nozzle 66 are positioned under the gas supply passage 84.

The gas supply passage 84 communicates with the discharge pressure adjusting chamber S so that the pressure inside the discharge adjusting chamber S becomes equal to the pressure inside the gas supply passage 84. The pressure of the gas supply passage 84 is equal to the supply pressure of the mist-containing gas and the supply pressure of the mist-containing gas is equal to the set pressure of the control section 80 for controlling the fan 78 so that the pressure of the discharge pressure adjusting chamber S is maintained at the set pressure of the control section 80 when the mist-containing gas is supplied. Consequently, the resist solution is discharged from the resist solution discharge ports 82 at a pressure equal to the fixed set pressure of the pump 73 from which the set pressure of the control section 80 is subtracted, namely, at a pressure equal to the pressure inside the storage section 81 from which the pressure inside the discharge adjusting chamber S is subtracted.

The plural mist-containing gas discharge ports 85 as the solvent mist discharge ports are provided on the negative direction side of the Y direction on the lower surface of the discharge nozzle 66 on an extended line of the slit 83 as shown in FIG. 7 and FIG. 8, and each of them has, for example, a circular shape. The mist-containing gas discharge ports 85 are disposed so as to be in a position facing the outer edge portion of the wafer W when the discharge nozzle 66 is transferred to the position above the radius of the wafer W. Therefore, the mist-containing gas is discharged onto the outer edge portion of the wafer W from each of the mist-containing gas discharge ports 85 via the gas supply passage 84 when it is supplied into the discharge nozzle 66 from the gas supply pipe 71.

An air supply pipe 86 for supplying a purified gas, for example, an air whose temperature and humidity are adjusted, is attached to an upper surface of the casing 17a, and it supplies the above gas and maintains the inside of the cup 63 in the state of a predetermined atmosphere at the time of treating the wafer W, and at the same time it can purge the inside of the cup 63.

Next, the operations of the resist coating unit 17 as structured above will be explained along with the steps of the photolithography process carried out in the coating and developing system 1.

First, one unprocessed wafer W is taken out of the cassette C by the wafer carrier 7 and then carried into the extension unit 32 included in the third processing unit group G3. Next, the wafer W is carried into the adhesion unit 31 by the main carrier 13 and, for example, HMDS for improving fixability of the resist solution is applied on the wafer W. Next, the wafer W is carried to the cooling unit 30 to be cooled to a predetermined temperature. Then, the wafer W cooled to the predetermined temperature is carried, for example, to the resist coating unit 17 by the main carrier 13.

The wafer W coated with the resist solution in the resist coating unit 17 is carried to the pre-baking unit 33, the extension and cooling unit 41 in sequence by the main carrier 13, and is further carried to the edge exposure unit 51 and the aligner (not shown) in sequence by the wafer carrier 50 to undergo predetermined treatments in the respective processing units. Then, the wafer W after undergoing the exposure treatment is carried to the extension unit 42 by the wafer carrier 50, and thereafter, carried to the post-exposure baking unit 44, the cooling unit 43, the developing unit 18, the post-baking unit 46, and the cooling unit 30 in sequence by the main carrier 13 to undergo predetermined processing in the respective units. Thereafter, the wafer W is returned to the cassette C via the extension unit 32 to finish a series of the coating and developing treatment.

Next, the operations of the resist coating unit 17 described above will be explained in detail. The set pressure of the pump 73 in the supply pipe 70 is set at a pressure P1 and the set pressure of the control section 80 of the fan 78 is set at a pressure P2. The pressure P2 satisfies a condition of, for example, the pressure P1>the pressure P2. It is preferable to determine the P2 at such a value to cause the discharge amount of the resist solution to be a minimum amount necessary for forming on the wafer W a resist film having a predetermined thickness by discharging the resist solution for a certain time.

Before the resist coating treatment is started, the supply of the purified air whose temperature is adjusted, for example at 23° C. is started from the air supply pipe 86 of the casing 17a, while the exhaust from the exhaust duct 65 of the cup 63 is started. Thereby, the inside of the cup 63 is maintained in the state of a purified atmosphere at a predetermined temperature and particles produced during the coating treatment are purged.

When the resist coating treatment is started, the wafer W after undergoing, for example, the cooling processing, which is a pre-step of the resist coating treatment, in the cooling unit 30 is carried into the casing 17a by the main carrier 13. The wafer W carried thereto is delivered to the spin chuck 60 to be held on the spin chuck 60 by suction. Next, the discharge nozzle 66 which is kept on stand-by in the stand-by position T is transferred to the position above the radius of the wafer W by the arm 67 as shown in FIG.

5. At this time, the resist solution discharge ports 82 are positioned above the center of the wafer W and the mist-containing gas discharge ports 85 are positioned above the outer edge portion of the wafer W, as shown in FIG. 7. At this time, the drive section 61 starts to rotate the spin chuck 60 at the predetermined rotation speed, thereby rotating the wafer W.

Figure 9:
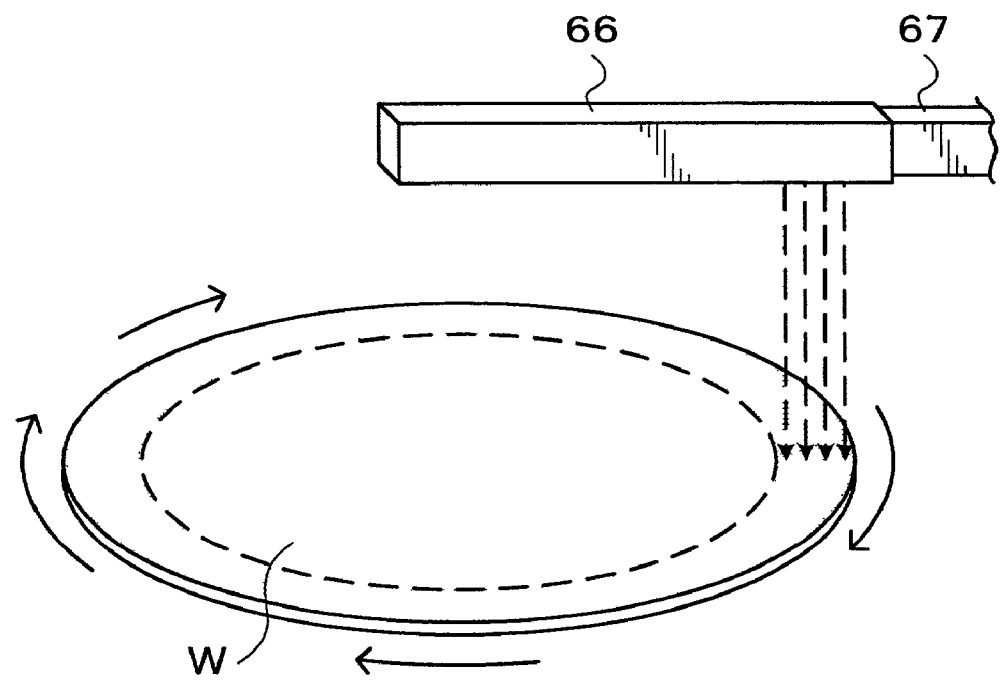
FIG. 9 is an explanatory view showing a state in which a mist-containing gas is discharged from the discharge nozzle.

Subsequently, for example, the fan 78 of the gas supply pipe 71 is operated so that the mist-containing gas which is controlled to be at the pressure P2 by the control section 80 is supplied into the gas supply passage 84 from the gas producing tank 75 via the gas supply pipe 71. This mist-containing gas passes through the gas supply passage 84 to be discharged onto the wafer W from the mist-containing gas discharge ports 85. The discharged mist-containing gas is discharged onto the outer edge portion of the rotated wafer W as shown in FIG. 9 and the solvent mist is supplied onto the outer edge portion of the wafer W. At this time, the pressure of the discharge pressure adjusting chamber S which communicates with the gas supply passage 84 is maintained at the pressure P2.

Soon after the mist-containing gas is discharged, the open/close valve 74 is opened so that, as shown in FIG. 7, the resist solution in the resist tank 72 is supplied into the storage section 81 at the pressure P1 by the pump 73. Then, the resist solution supplied into the storage section 81 is discharged from each of the resist solution discharge ports 82 at the pressure equal to the pressure of the storage section 81 from which the pressure of the discharge pressure adjusting chamber S is subtracted, namely, at the pressure of P1−P2.

Figure 10:
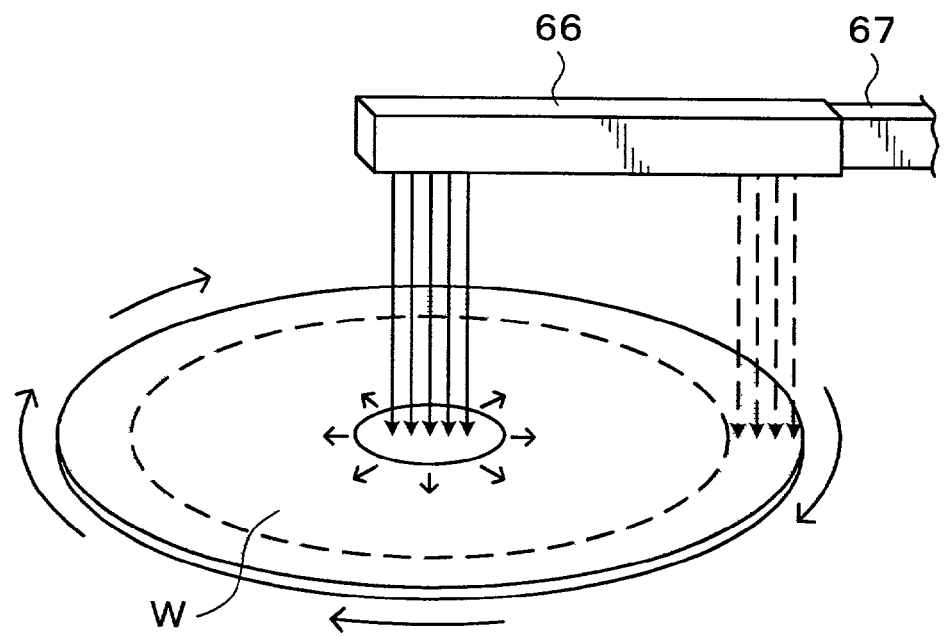
FIG. 10 is an explanatory view showing a state in which a resist solution is applied onto a wafer.

The resist solution discharged from each of the resist solution discharge ports 82 passes through the slit 83, and as shown in FIG. 10, is supplied onto the center potion of the wafer W. The resist solution supplied onto the center portion of the wafer W is diffused to the outer edge portion of the wafer W by the centrifugal force. A solvent originally contained in the resist solution is volatilized as the resist solution is diffused to a portion closer to the outer edge portion of the wafer W, but the volatilized solvent is compensated for by replenishing an equal amount of the solvent mist which is supplied onto the outer edge portion of the wafer W so that the viscosity of the resist solution is maintained. Therefore, the resist solution is smoothly diffused up to the outer edge portion of the wafer W. A predetermined amount of the resist solution is supplied onto the wafer W by a predetermined duration of the discharge to form a solution film of the resist solution on the wafer W. When the solution film is thus formed on the wafer W, the open/close valve 74 is closed to finish the supply of the resist solution. At the same time, the fan 78 is also stopped to finish the discharge of the mist-containing gas. Thereafter, the discharge nozzle 66 is transferred to the stand-by position T again by the arm 67.

Meanwhile, the wafer W continues to be rotated so that the solution film on the wafer W is flattened and a film thickness is adjusted to the predetermined film thickness. When the resist film having the predetermined film thickness is thus formed on the wafer W, the rotation of the wafer W is stopped.

Thereafter, the wafer W is delivered to the main carrier 13 and carried out of the casing 17a so that a series of the resist coating treatment is finished.

It is preferable to change an amount of the resist solution supplied onto the wafer W to a proper amount when the lot of the wafer W is changed. A case when the supply amount of the resist solution is changed will be explained below.

First, the set pressure of the pump 73 is maintained at the pressure P1 and the set pressure P2 of the control section 80 is changed. For example, when the supply amount of the resist solution is to be increased, the set pressure of the control section 80 is changed from the pressure P2 to a lower pressure (P2−α). Thereby, the pressure inside the discharge pressure adjusting chamber S at the time of the treatment becomes the pressure (P2−α) to increase a pressure difference from the pressure P1 inside the storage section 81 so that the discharge pressure of the resist solution is increased. This enables the increase in the amount of the resist solution supplied onto the wafer W during a predetermined time. Meanwhile, when the supply amount of the resist solution is to be decreased, the set pressure of the control section 80 is changed to a pressure (P2+α) which is higher than the pressure P2. Thereby, the pressure of the discharge pressure adjusting chamber S at the time of the treatment becomes the pressure (P2+α) to decrease the discharge pressure of the resist solution so that the amount of the resist solution supplied during the predetermined time is decreased.

According to the embodiment described above, the discharge nozzle 66 is formed in the elongated shape whose length is approximately equal to the radius of the wafer W, and the resist solution discharge ports 82 and the mist-containing gas discharge ports 85 are so disposed that the former faces the center of the wafer W and the latter faces the outer edge portion of the wafer W respectively when the discharge nozzle 66 is transferred to the position above the radius of the wafer W, so that the solvent mist can be supplied onto the outer edge portion of the wafer W while the resist solution is supplied onto the center of the wafer W. The solvent mist is thus supplied onto the outer edge portion of the wafer W so that the viscosity of the resist solution diffused to the outer edge portion from the center of the wafer W is maintained and the resist solution is diffused appropriately up to the outer edge portion of the wafer W. Therefore, the resist film on the outer edge portion of the wafer W is formed to have an equal film thickness to that of the resist film on the center portion of the wafer W so that the uniform resist film is formed over the entire surface of the wafer W. Furthermore, since the solvent mist is supplied, a relatively large amount of the solvent is supplied onto the wafer W so that the viscosity of the resist solution can be surely maintained.

Moreover, since the discharge pressure adjusting chamber S is provided in an opening side of the resist solution discharge ports 82 and the discharge pressure adjusting chamber S communicates with the gas supply passage 84, the discharge pressure of the resist solution can be freely changed by the control section 80 for controlling the pressure inside the gas supply passage 84. Therefore, when the lot of the wafer W is changed, the supply amount of the resist solution onto the wafer W can be changed by changing the set pressure of the control section 80 to change the discharge pressure of the resist solution. Furthermore, since the discharge pressure of the resist solution can be adjusted only by the supply pressure of the mist-containing gas, finer adjustment is enabled so that the supply amount of the resist solution can be adjusted more strictly. Consequently, the amount of the resist solution used can be reduced by making a fine adjustment of the supply amount of the resist solution to a proper amount which is a minimum necessary amount for forming the predetermined resist film.

Since the narrow slit 83 is provided in the position of the discharge nozzle 66 facing the resist solution discharge ports 82, the pressure inside the discharge pressure adjusting chamber S is stabilized so that the discharge pressure of the resist solution can be more easily controlled.

Since the plural resist solution discharge ports 82 are provided, the resist solution is discharged also near the center of the wafer W so that the supply and the diffusion of the resist solution are promoted. Incidentally, the number of the resist solution discharge ports 82 may of course be singular. Furthermore, though the plural mist-containing gas discharge ports 85 are provided, the number of the mist-containing gas discharge ports 85 may be singular. Further, the mist-containing gas discharge ports 85 may be in other shapes such as a square shape instead of the circular shape.

Figure 11:
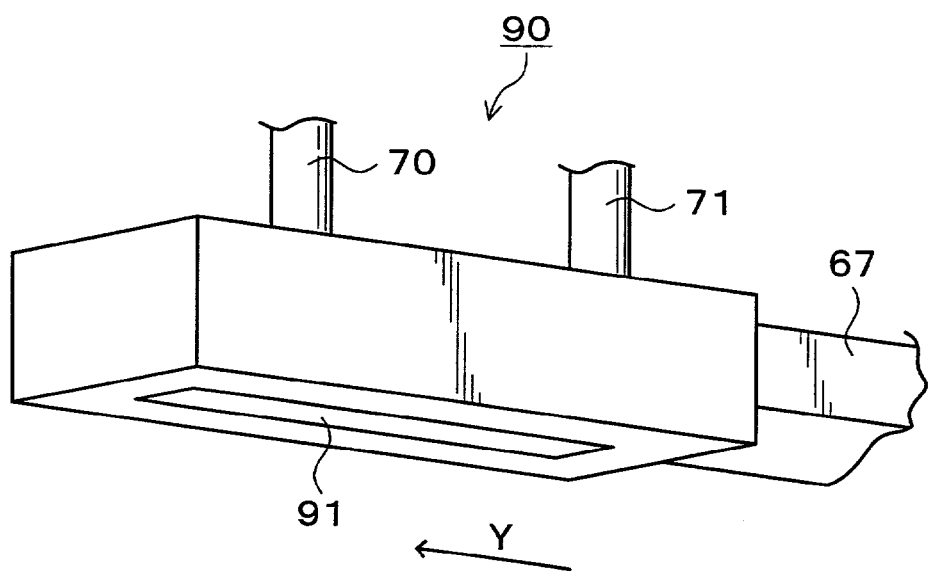
FIG. 11 is a perspective view showing another structure example of a discharge nozzle.

In the above-described embodiment, the mist-containing gas discharge ports 85 are provided separately, but the slit 83 may play a role of the mist-containing gas discharge ports. A discharge nozzle 90 shown in FIG. 11 shows one example thereof, and a slit 91 extending to a negative direction side of a Y direction of the discharge nozzle 90 is provided on a lower surface of this discharge nozzle 90. The slit 91 is formed from a position facing the resist solution discharge ports 82 to a position facing the gas supply passage 84 so that the resist solution and the mist-containing gas are supplied onto the wafer W from this slit 91. Since the slit 91 is thus used as the mist-containing gas discharge ports, it is not necessary to separately provide the mist-containing gas discharge ports so that the manufacture of the discharge nozzle 90 is simplified.

In the above-described embodiment, a pressure sensor for measuring the pressure inside the discharge pressure adjusting chamber S or the gas supply passage 84 may be provided so that the control section 80 makes a fine adjustment of the pressure inside the discharge pressure adjusting chamber S based on the measured value of this pressure sensor. This enables the discharge pressure adjusting chamber S to be maintained at the set pressure P2 more accurately so that the discharge pressure of the resist solution can be controlled more strictly.

In the above-described embodiment, the discharge pressure adjusting chamber S communicates with the gas supply passage 84 and the pressure inside the discharge pressure adjusting chamber S is controlled by the supply pressure of the mist-containing gas, but the pressure inside the discharge pressure adjusting chamber S may be separately adjusted instead of having the discharge pressure adjusting chamber S communicate with the gas supply passage 84.

Figure 12:
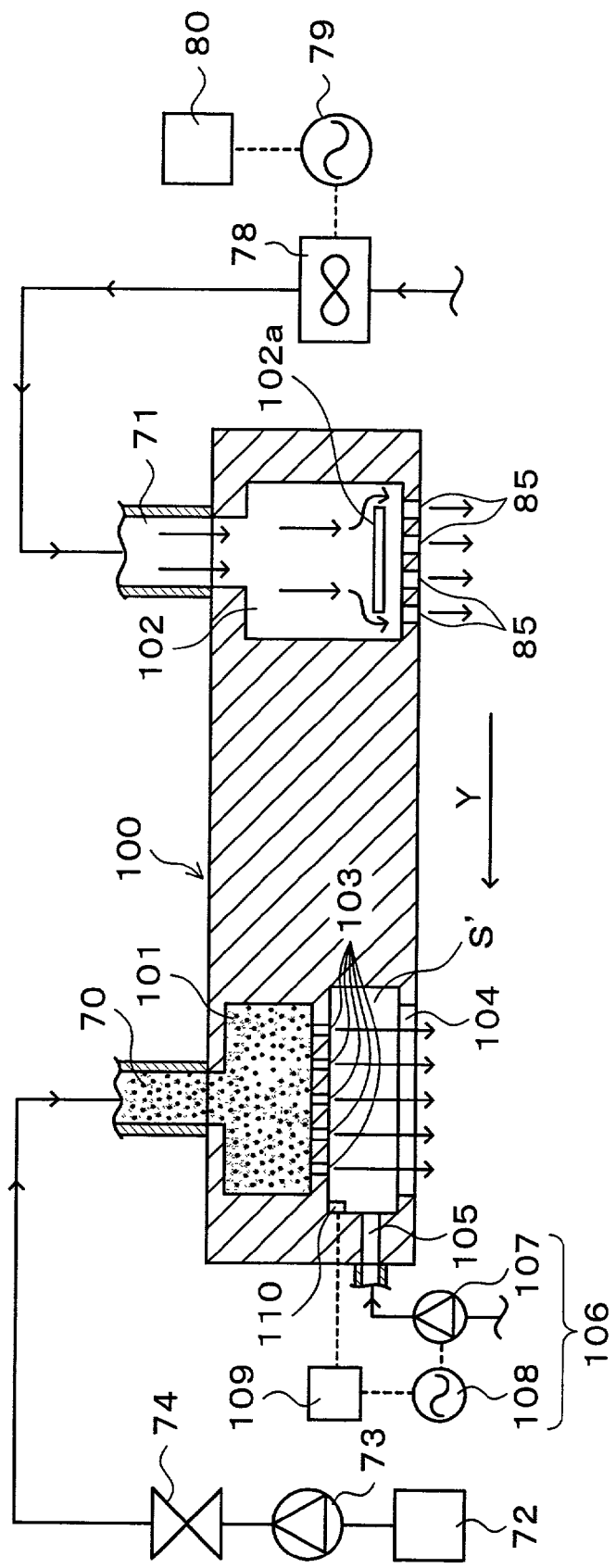
FIG. 12 is an explanatory view of a vertical cross section showing still another structure example of a discharge nozzle.

For example, a discharge pressure adjusting chamber S' separated from the gas supply passage 102 is provided under the storage section 101 in the discharge nozzle 100 as shown in FIG. 12. Resist solution discharge ports 103 open into the discharge pressure adjusting chamber S' and a slit 104 is disposed in a position facing the resist solution discharge ports 103. A gas supply pipe 105 for supplying a predetermined gas, for example, an inert gas, a nitrogen gas, and so on into the discharge pressure adjusting chamber S' is provided on the discharge pressure adjusting chamber S'. In this case, a diffuser panel 102a may be horizontally disposed in the gas supply passage 102. When the diffuser panel 102a is disposed, the solvent mist-containing gas supplied from the gas supply passage 102 is diffused after once colliding with this diffuser panel 102a, and thereafter, uniformly discharged from the plural mist-containing gas discharge ports 85 thereunder.

A pressure adjusting unit 106 for adjusting the pressure of the aforesaid gas supplied into the discharge pressure adjusting chamber S' is provided in the gas supply pipe 105. The pressure adjusting unit 106 includes, for example, a pump 107, a power source 108 of this pump 107, a control section 109 for operating this power source 108, and a pressure sensor 110 for detecting the pressure inside the discharge pressure adjusting chamber S'. The pressure sensor 110 is provided in the discharge pressure adjusting chamber S'. The detection value detected in the pressure sensor 110 is outputted to the control section 109. The control section 109 operates the power source 108 and controls the pressure of the pump 107 based on this detection value so as to adjust the inside of the discharge pressure adjusting chamber S' to the set pressure. This causes the discharge pressure adjusting chamber S' to be maintained at the set pressure and makes it possible to maintain and adjust the discharge pressure of the resist solution similarly to the aforesaid embodiment.

Figure 13:
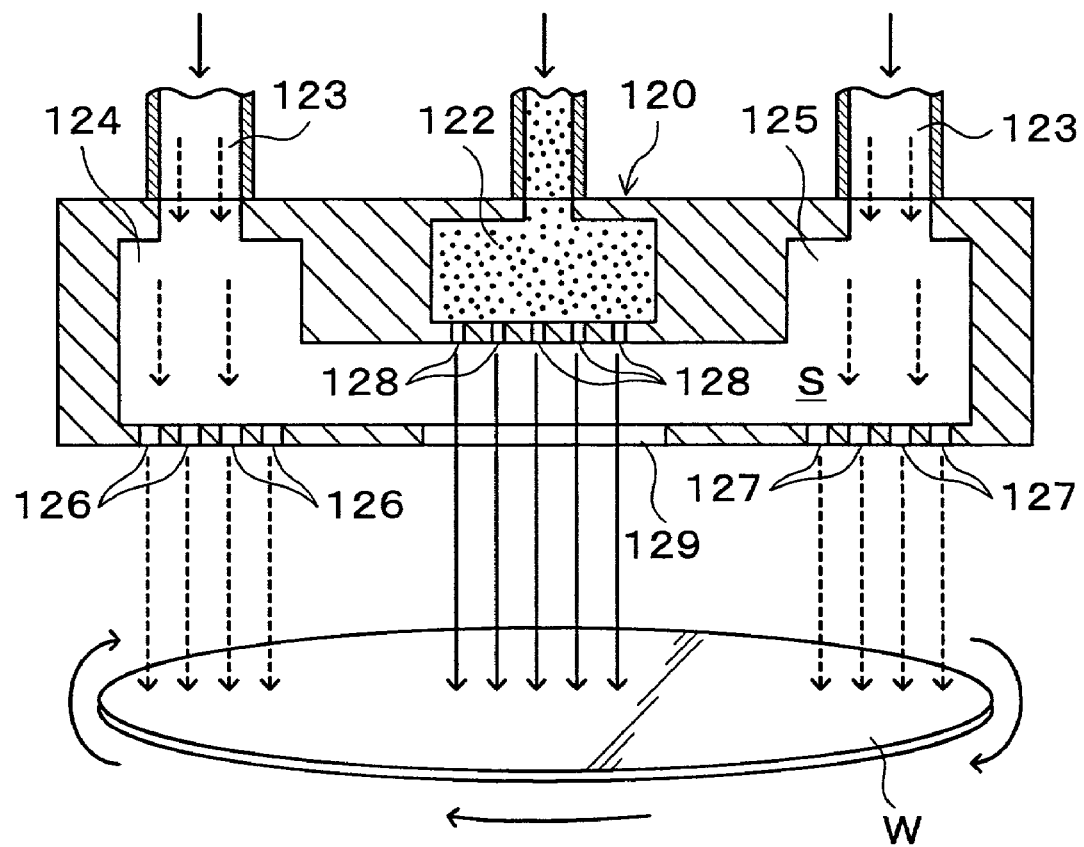
FIG. 13 is an explanatory view of a vertical cross section showing a structure example of a discharge nozzle when the discharge nozzle is formed to have a length equal to the diameter of the wafer.

The discharge nozzle 66 may have an elongated shape whose length is substantially equal to the diameter of the wafer W. A discharge nozzle 120 shown in FIG. 13, which shows one example thereof, includes a storage section 122, which is provided in a center part in a longitudinal direction in the discharge nozzle 120, for temporarily storing the resist solution, and gas supply passages 124 and 125 which are provided near both of the end portions in the longitudinal direction respectively and to which the mist-containing gas is supplied from a gas supply pipe 123. The gas supply passages 124 and 125 communicate with mist-containing gas discharge ports 126 and 127 respectively. Resist solution discharge ports 128 communicating with the storage section 122 are provided in a lower part of the storage section 122, and the discharge pressure adjusting chamber S into which the resist solution discharge ports 128 open is provided in a further downward part. The discharge pressure adjusting chamber S communicates with each of the gas supply passages 124 and 125 so that the pressure inside the discharge pressure adjusting chamber S becomes equal to the supply pressure of the mist-containing gas passing through the gas supply passages 124 and 125. A slit 129 is provided in a position facing the resist solution discharge ports 128. Incidentally, the other structure is the same as that of the discharge nozzle 66 previously described and the explanation thereof will be omitted.

At the time of the resist coating treatment, the discharge nozzle 120 moves above the diameter of the wafer W, the wafer W is rotated similarly to the embodiment previously described, the solvent mist is supplied to the outer edge portion of the wafer W from each of the mist-containing gas discharge ports 126 and 127, and the resist solution is supplied onto the center of the wafer W from the resist solution discharge ports 128. The resist solution is diffused to the outer edge portion of the wafer W by the centrifugal force while the solvent mist is replenished to the resist solution in the outer edge portion of the wafer W, so that a resist film having a predetermined thickness is formed on the wafer W.

Since the discharge nozzle 120 is thus formed to have the length equal to the diameter of the wafer W and the mist-containing gas discharge ports 126 and 127 are provided near both of the end portions thereof, the solvent mist is supplied to the outer edge portion of the wafer W at two places so that the solvent mist is supplied more appropriately and reliably.

Figure 14:
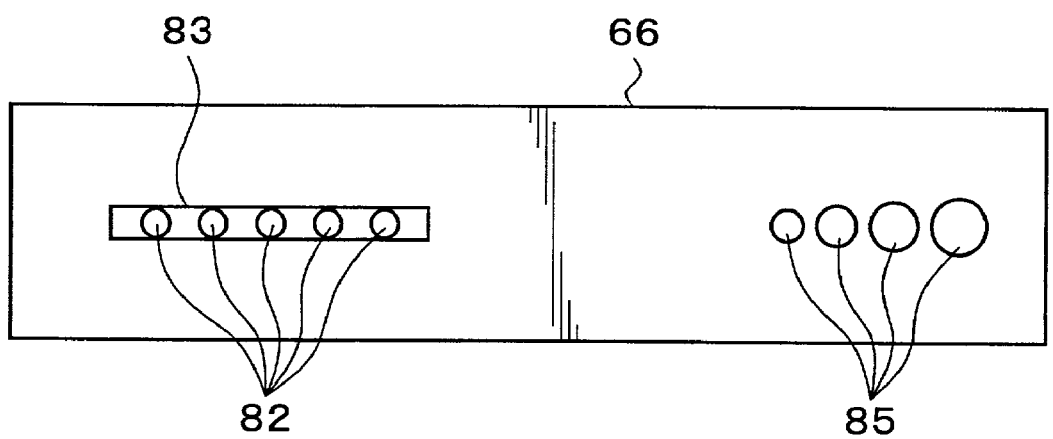
FIG. 14 is a bottom view of a discharge nozzle in which solvent mist discharge ports have different diameters from each other.

Incidentally, as for the mist-containing gas discharge ports 85 or the like, the one which is positioned closer to an outer end of the discharge nozzle 66 may be formed to have a larger diameter, for example, as shown in FIG. 14. This makes it possible to supply a larger amount of the mist-containing gas to a portion nearer to the outer edge portion of the wafer W. As a result, a larger amount of the mist can be supplied to a region whose circumferential speed is higher and from which the solvent in the resist solution is more easily volatilized so that uniformity of the film thickness on the wafer W is further improved as a whole.

Figure 15:
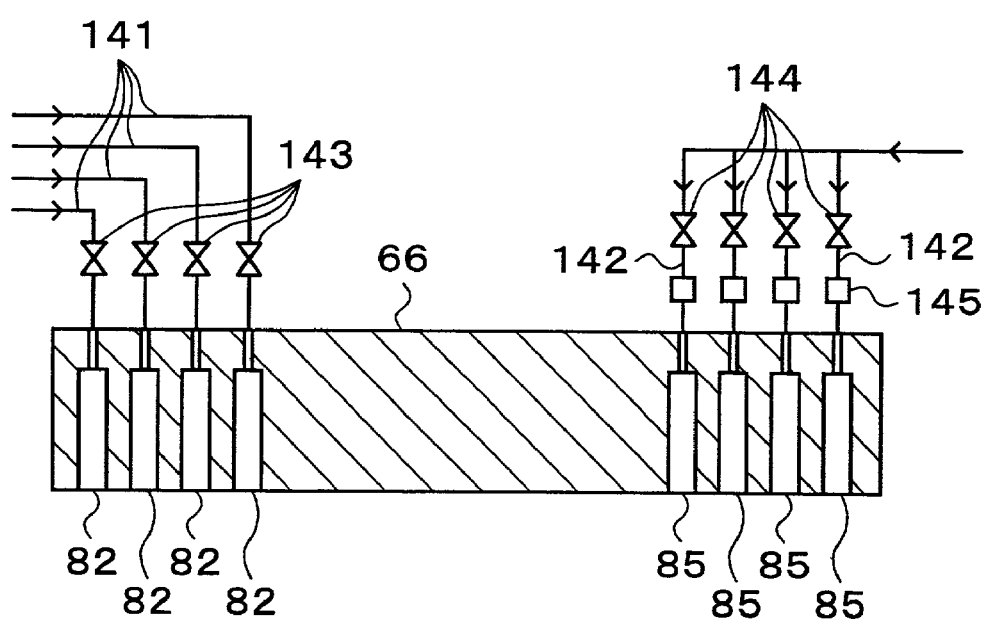
FIG. 15 is a vertical sectional view of a discharge nozzle when supply systems of a resist solution and a solvent mist-containing gas are independently provided for respective discharge ports.

Still more, when the plural resist solution discharge ports 82 and mist-containing gas discharge ports 85 are provided in the discharge nozzle 66, the resist solution and the mist-containing gas may be supplied from resist solution supply systems 141 and mist-containing gas supply systems 142 respectively which are independently provided for the respective discharge ports, as shown in FIG. 15. A valve 143 is provided in each of the resist solution supply systems 141, and a valve 144 and a mass flow controller 145 are provided in each of the mist-containing gas supply systems 142.

The use of the discharge nozzle 66 having such independent supply systems makes it possible, for example, to discharge a larger amount of the resist solution to a region more distant from the center of the wafer W and discharge a larger amount of the solvent mist to a region closer to the outer edge portion of the wafer W. Furthermore, especially as for the resist solution, different kinds of the resist solutions can be discharged from one discharge nozzle.

Figure 16:
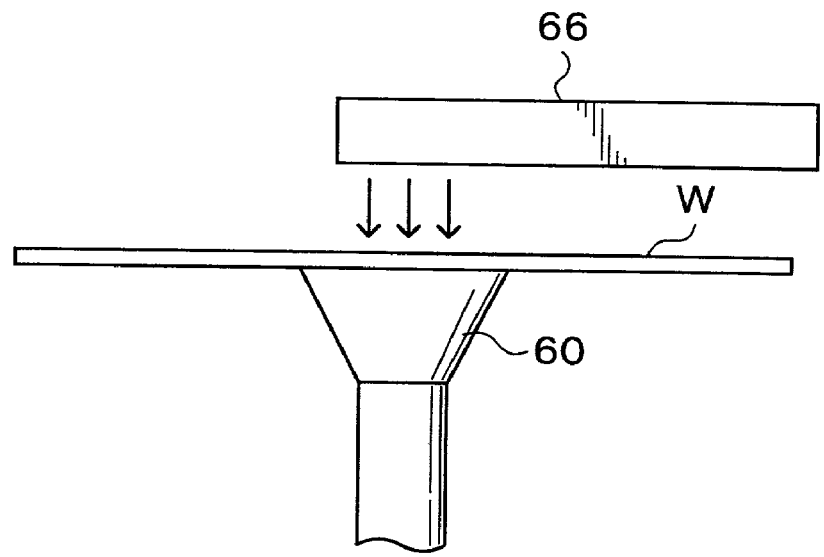
FIG. 16 is a side view showing the position of the discharge nozzle in terms of height when it discharges the resist solution.

In the cases when the resist coating treatment is carried out using the discharge nozzles 66, 100, and 120, the resist coating treatment may be carried out in such a manner that the discharge nozzle 66 is positioned at a normal height when the resist solution is discharged, for example, as shown in FIG. 16, and thereafter, the mist-containing gas is discharged when the process of diffusing the resist solution by the rotation of the spin chuck 60 is started. Then, the discharge amount of the mist-containing gas may be controlled to be decreased after a predetermined time passes after the resist solution is diffused over the entire surface of the wafer W. Through the process described above, more appropriate coating of the resist film is made possible, the uniformity of the film thickness can be improved, and the amount of the mist used can be suppressed.

Figure 17:
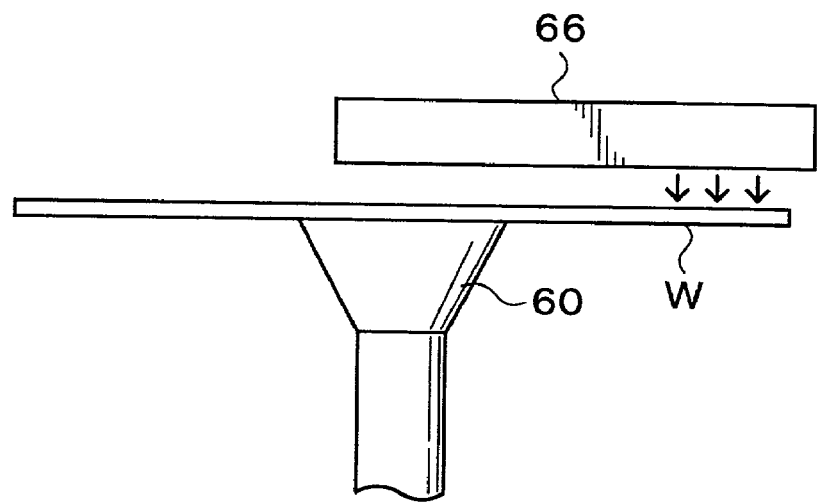
FIG. 17 is a side view showing the position of the discharge nozzle in terms of height when it discharges the solvent mist-containing gas.

Furthermore, when the discharge of the mist-containing gas is started, the mist-containing gas is discharged in a state in which the discharge nozzle 66 is moved closer to the wafer W, as shown in FIG. 17, than in the case of the resist solution discharge in FIG. 16 so that the diffusion of the mist to a surrounding area can be suppressed.

Moreover, as for the rotation speed of the wafer W, when the rotation speed is gradually lowered after the discharge amount of the mist-containing gas is reduced and thereafter, the rotation speed is fixed, the diffusion of the mist can be further suppressed.

In the above-described embodiments, the present invention is applied to a resist coating unit for applying a resist solution, but it is applicable to other coating units, for example, a developing unit for applying a developing solution and so on. In the above-described embodiments, the present invention is applied to a coating unit in a photolithography step in semiconductor wafer device fabricating processes, but the present invention is applicable to a coating unit for substrates other than a semiconductor wafer, for example, an LCD substrate.

According to the present invention, since the viscosity of a coating solution applied on a substrate surface can be maintained low, a coating film having a predetermined thickness is formed also in an outer edge portion of the substrate and a uniform coating film is formed over the substrate surface so that improvement in yield is realized.

What is claimed is:

1. A coating unit for coating a substrate with a coating solution, comprising:
    a coating solution discharge device configured to discharge the coating solution onto the substrate and having a length longer than a radius of the substrate, the coating solution discharge device having at least one coating solution discharge port positioned to supply the coating solution to a center portion of the substrate and a plurality of solvent mist discharge ports positioned to supply a solvent mist of the coating solution to peripheral portions of the substrate;
    a storage section configured to store the coating solution and connected to the coating solution discharge port;
    a discharge pressure adjusting chamber having a pressure and configured to discharge the coating solution onto the substrate at a predetermined pressure;
    a gas supply passage through which a gas containing the solvent mist is supplied to the plurality of solvent mist discharge ports, wherein the gas supply passage is connected to the discharge pressure adjusting chamber, and a diffuser panel is disposed in the gas supply passage so that the gas containing the solvent mist is uniformly discharged from the plurality of solvent mist discharge ports; and
    a pressure adjusting unit configured to adjust the pressure of the discharge pressure adjusting chamber.

2. A coating unit according to claim 1,
wherein the solvent mist discharge port comprises a slit.

3. A coating unit according to claim 1,
wherein the at least one coating solution discharge port comprises a plurality of coating solution ports.

4. A coating unit according to claim 3,
further comprising a supply system configured to supply the coating solution independently to each of the plurality of coating solution discharge ports.

5. A coating unit according to claim 1,
wherein each end portion of the coating solution discharge device has a plural number of the solvent mist discharge ports.

6. A coating unit according to claim 5,
further comprising a supply system configured to supply the solvent mist independently to each of the plurality of solvent mist discharge ports.

7. A coating unit according to claim 5,
wherein the plurality of solvent mist discharge ports has first ports and second ports, the first ports have a larger diameter than the second ports, and the first ports are positioned an outer end of the each end portion of the coating solution discharge device than the second ports.

* * * * *